(12) United States Patent
Zhou et al.

(10) Patent No.: US 10,311,794 B2
(45) Date of Patent: Jun. 4, 2019

(54) PIXEL DRIVER CIRCUIT AND DRIVING METHOD THEREOF

(71) Applicant: Shenzhen China Star Optoelectronics Semiconductor Display Technology Co., Ltd., Shenzhen (CN)

(72) Inventors: Xuebing Zhou, Shenzhen (CN); Xiaolong Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/580,273

(22) PCT Filed: Nov. 16, 2017

(86) PCT No.: PCT/CN2017/111428
§ 371 (c)(1),
(2) Date: Dec. 7, 2017

(87) PCT Pub. No.: WO2019/037306
PCT Pub. Date: Feb. 28, 2019

(65) Prior Publication Data
US 2019/0066586 A1    Feb. 28, 2019

(30) Foreign Application Priority Data
Aug. 23, 2017   (CN) .......................... 2017 1 0730988

(51) Int. Cl.
*G09G 3/3258*    (2016.01)
*H01L 27/12*     (2006.01)
*H01L 51/52*     (2006.01)

(52) U.S. Cl.
CPC ....... *G09G 3/3258* (2013.01); *H01L 27/1214* (2013.01); *H01L 51/5206* (2013.01);
(Continued)

(58) Field of Classification Search
CPC ... G09G 3/3258; G09G 3/3208; G09G 3/3233
See application file for complete search history.

(56) References Cited

U.S. PATENT DOCUMENTS

2017/0294162 A1* 10/2017 Hu ........................ G09G 3/3233

FOREIGN PATENT DOCUMENTS

CN    101075410 A    11/2007
CN    102339586 A    2/2012
(Continued)

*Primary Examiner* — Dennis P Joseph
(74) *Attorney, Agent, or Firm* — Leong C. Lei

(57) ABSTRACT

The invention discloses a pixel driver circuit and driving method thereof. The pixel driver circuit comprises a first TFT (T1) connected to first node (G) and second node (K); a second TFT (T2), connected to first control signal (S1), first node (G) and second node (K); a third TFT (T3), connected to second control signal (S2) and second node (K); a fourth TFT (T4), connected to first control signal (S1), third node (N) and reference voltage (Vref); a fifth TFT (T5), connected to first control signal (S1), third node (N) and data signal (Vdata); a sixth TFT (T6), connected to third control signal (S3); a first capacitor (C1) and a second capacitor; the reference voltage (Vref) being less than data signal Vdata). The invention also provides a corresponding driving method. The invention uses internal detection to eliminate luminance inconsistency caused by change of the driving TFT threshold voltage.

8 Claims, 4 Drawing Sheets

(52) U.S. Cl.
CPC . *H01L 51/5221* (2013.01); *G09G 2310/0264* (2013.01); *G09G 2320/0233* (2013.01)

(56) References Cited

FOREIGN PATENT DOCUMENTS

| | | |
|---|---|---|
| CN | 102800273 A | 11/2012 |
| CN | 102930824 A | 2/2013 |
| CN | 104715716 A | 6/2015 |
| CN | 105702214 A | 6/2016 |
| CN | 106782322 A | 5/2017 |
| KR | 20130010936 A | 1/2013 |

\* cited by examiner

PIXEL DRIVER CIRCUIT AND DRIVING METHOD THEREOF

BACKGROUND OF THE INVENTION

1. Field of the Invention

The present invention relates to the field of display techniques, and in particular to a pixel driver circuit and driving method thereof.

2. The Related Arts

As a new-generation display technology, the organic light emitting diode (OLED) display provides the advantages of low power consumption, high color gamut, high resolution, wide viewing angle, quick response time, and so on, and attracts much market attention.

The driving types of OLED can be divided, according to the driving method, into the passive matrix OLED (PMOLED) and active matrix OLED (AMOLED); wherein the AMOLED provides the advantages of pixels arranged in an array, self-luminous, and high luminous efficiency and is commonly used for high definition large-size display. AMOLED is a current-driven device and the light-emitting luminance is determined by the current flowing through the OLED. Most of the known integrated circuits (ICs) only transmit voltage signals, so the AMOLED pixel driver circuit needs to complete the task of converting the voltage signal into a current signal.

As shown in FIG. 1, a known 2T1C pixel driver circuit for AMOLED is shown. The 2T1C refers to the driver circuit comprising two thin film transistors (TFTs) and a capacitor, wherein one TFT T2 is a switching TFT, controlled by a scan signal SCAN, for controlling the entry of data signal DATA, serving as a switch for charging the capacitor Cst, and the other TFT T1 is a driving TFT, for driving the OLED and controlling the current flowing through the OLED; the capacitor Cst is for storing the DATA signal so as to control the driving current of the T1 on the OLED. The scan signal SCAN is from a gate driver, corresponding to a certain scan line, the data signal DATA is from a source driver, corresponding to a certain data line. OVDD is a high voltage of the power source, and OVSS is the low voltage of the power source.

The driving TFT (T1 in FIG. 1) of the AMOLED panel (2T1C pixel driver circuit) having a threshold voltage Vth drifts as the operation time and driving current change, or the electron migration rate will change. The drifting or ageing of the threshold voltage Vth of the driving TFT will cause the change of the current Id flowing through the OLED, and the changing of the OLED current has a direct impact on the luminance uniformity and consistency of the AMOLED panel and affect the AMOLED panel display quality and effect.

SUMMARY OF THE INVENTION

The object of the present invention is to provide a pixel driver circuit, able to eliminate the luminance inconsistency caused by the change in driving TFT threshold voltage.

Another object of the present invention is to provide a driving method of pixel driver circuit, able to eliminate the luminance inconsistency caused by the change in driving TFT threshold voltage.

To achieve the above object, the present invention provides a pixel driver circuit, which comprises:

a first thin film transistor (TFT), having a gate connected to a first node, a source and a drain connected respectively to a high voltage power source and a second node;

a second TFT, having a gate connected to a first control signal, a source and a drain connected respectively to the first node and the second node;

a third TFT, having a gate connected to a second control signal, a source and a drain connected respectively to the second node and an anode of an OLED;

the OLED, having a cathode connected to a low voltage power source;

a fourth TFT, having a gate connected to the first control signal, a source and a drain connected respectively to a third node and a reference voltage;

a fifth TFT, having a gate connected to the first control signal, a source and a drain connected respectively to the third node and a data signal;

a sixth TFT, having a gate connected to a third control signal, a source and a drain connected respectively to the third node and the first node;

a first capacitor, having two ends connected respectively to the first node and the high voltage power source; and a second capacitor, having two ends connected respectively to the first node and the third node;

wherein the reference voltage having a voltage level less than the data signal.

According to a preferred embodiment of the present invention, the first TFT, the second TFT, the third TFT, the fifth TFT, and the sixth TFT are P-type TFTs, and the fourth TFT is an N-type TFT.

According to a preferred embodiment of the present invention, the first control signal, the second control signal, and the third control signal are configured for an initialization phase, a threshold voltage detection phase, and a light-emitting phase.

According to a preferred embodiment of the present invention, in the initialization phase, the first control signal keeps at high voltage, the second control signal keeps at high voltage, and the third control signal keeps at low voltage.

According to a preferred embodiment of the present invention, in the threshold voltage detection phase, the first control signal keeps at low voltage, the second control signal keeps at high voltage, and the third control signal keeps at high voltage.

According to a preferred embodiment of the present invention, in the light-emitting phase, the first control signal keeps at high voltage, the second control signal keeps at low voltage, and the third control signal keeps at high voltage.

The present invention also provides a driving method of the aforementioned pixel driver circuit, which comprises: the first control signal, the second control signal, and the third control signal are configured for an initialization phase, a threshold voltage detection phase, and a light-emitting phase.

According to a preferred embodiment of the present invention, in the initialization phase, the first control signal keeps at high voltage, the second control signal keeps at high voltage, and the third control signal keeps at low voltage.

According to a preferred embodiment of the present invention, in the threshold voltage detection phase, the first control signal keeps at low voltage, the second control signal keeps at high voltage, and the third control signal keeps at high voltage.

According to a preferred embodiment of the present invention, in the light-emitting phase, the first control signal keeps at high voltage, the second control signal keeps at low voltage, and the third control signal keeps at high voltage.

The present invention also provides a pixel driver circuit, which comprises:

a first thin film transistor (TFT), having a gate connected to a first node, a source and a drain connected respectively to a high voltage power source and a second node;

a second TFT, having a gate connected to a first control signal, a source and a drain connected respectively to the first node and the second node;

a third TFT, having a gate connected to a second control signal, a source and a drain connected respectively to the second node and an anode of an OLED;

the OLED, having a cathode connected to a low voltage power source;

a fourth TFT, having a gate connected to the first control signal, a source and a drain connected respectively to a third node and a reference voltage;

a fifth TFT, having a gate connected to the first control signal, a source and a drain connected respectively to the third node and a data signal;

a sixth TFT, having a gate connected to a third control signal, a source and a drain connected respectively to the third node and the first node;

a first capacitor, having two ends connected respectively to the first node and the high voltage power source; and a second capacitor, having two ends connected respectively to the first node and the third node;

wherein the reference voltage having a voltage level less than the data signal;

wherein the first TFT, the second TFT, the third TFT, the fifth TFT, and the sixth TFT being P-type TFTs, and the fourth TFT being an N-type TFT;

wherein the first control signal, the second control signal, and the third control signal being configured for an initialization phase, a threshold voltage detection phase, and a light-emitting phase;

wherein in the initialization phase, the first control signal keeping at high voltage, the second control signal keeping high voltage, and the third control signal keeping at low voltage;

wherein in the threshold voltage detection phase, the first control signal keeping at low voltage, the second control signal keeping high voltage, and the third control signal keeping at high voltage.

In summary, the pixel driver circuit and driving method of the present invention, based on a 6T2C pixel driver circuit, uses internal detection approach to eliminate the luminance inconsistency caused by change of the driving TFT threshold voltage Vth.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
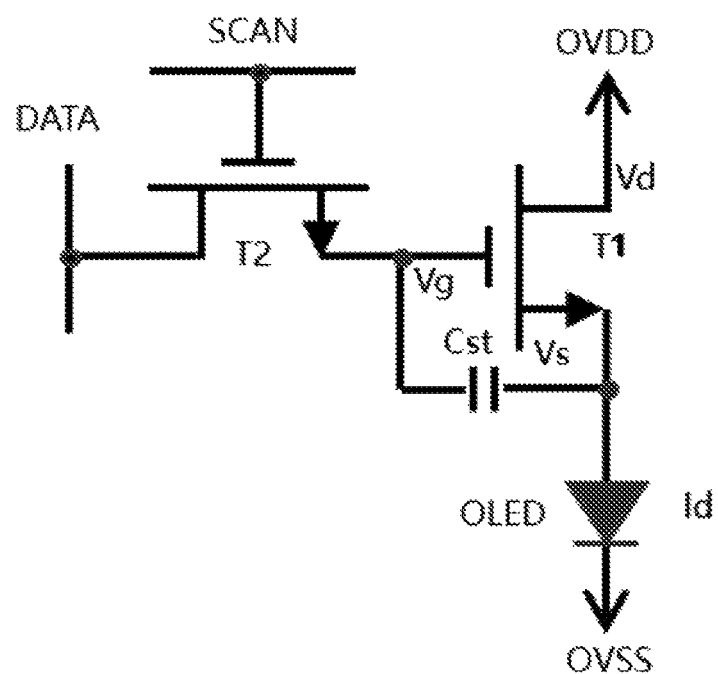
FIG. 1 is a schematic view showing a known 2T1C pixel driver circuit.
Figure 2:
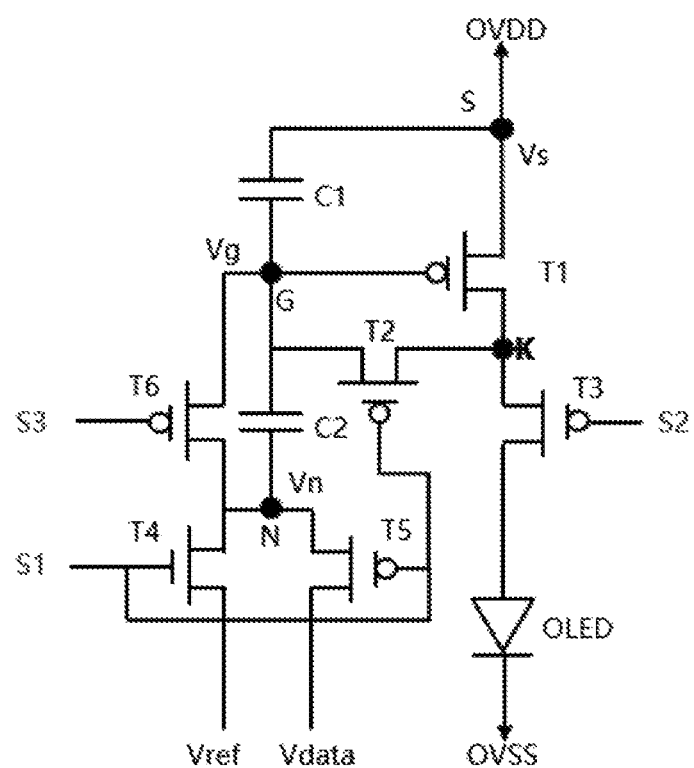
FIG. 2 is a schematic view showing the circuit of a preferred embodiment of the pixel driver circuit of the present invention.
Figure 3:
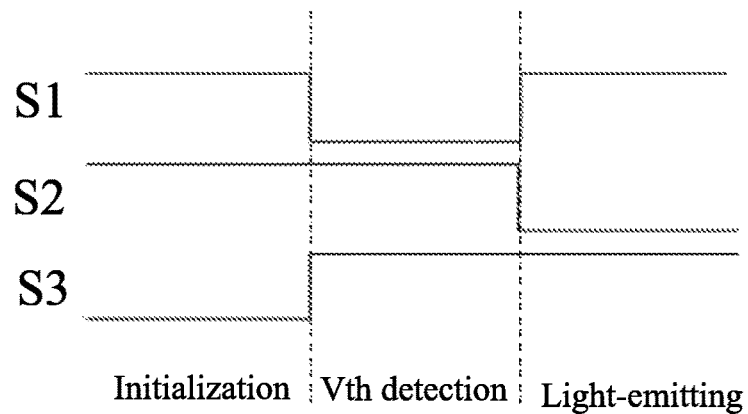
FIG. 3 is a schematic view showing the timing sequence of a preferred embodiment of the pixel driver circuit of the present invention.

Referring to FIG. 2 and FIG. 3, FIG. 2 is a schematic view showing the circuit of a preferred embodiment of the pixel driver circuit of the present invention; FIG. 3 is a schematic view showing the timing sequence. The preferred embodiment is a 6T2C pixel driver circuit, wherein the TFT T1, T2, T3, T5, and T6 are all P-type TFTs, and TFT T4 is an N-type TFT. TFT T1 is the driving TFT; S1, S2, S3 are control ports of the pixel driver circuit for inputting control signals to control the driving of the pixel driver circuit.

The present invention provides a novel 6T2C pixel driver circuit and a compensation method of the driving TFT threshold voltage Vth. The pixel driver circuit comprises: a first TFT T1, having a gate connected to a node G, a source and a drain connected respectively to a high voltage power source OVDD and a node K; a second TFT T2, having a gate connected to a control signal S1, a source and a drain connected respectively to the node G and the node K; a third TFT T3, having a gate connected to a control signal S2, a source and a drain connected respectively to the node K and an anode of an OLED; the OLED, having a cathode connected to a low voltage power source OVSS; a fourth TFT T4, having a gate connected to the control signal S1, a source and a drain connected respectively to a node N and a reference voltage Vref; a fifth TFT T5, having a gate connected to the control signal S1, a source and a drain connected respectively to the node N and a data signal Vdata; a sixth TFT T6, having a gate connected to a control signal S3, a source and a drain connected respectively to the node N and the node G; a capacitor C1, having two ends connected respectively to the node G and the high voltage power source OVDD; and a capacitor C2, having two ends connected respectively to the node G and the node N. In the preferred embodiment, the reference voltage Vref has a voltage level less than the data signal Vdata.

Refer to FIG. 3. The driving process of the pixel driver circuit comprises three phases: the initialization phase, the threshold voltage detection phase, and the OLED light-emitting phase.

Figure 4:
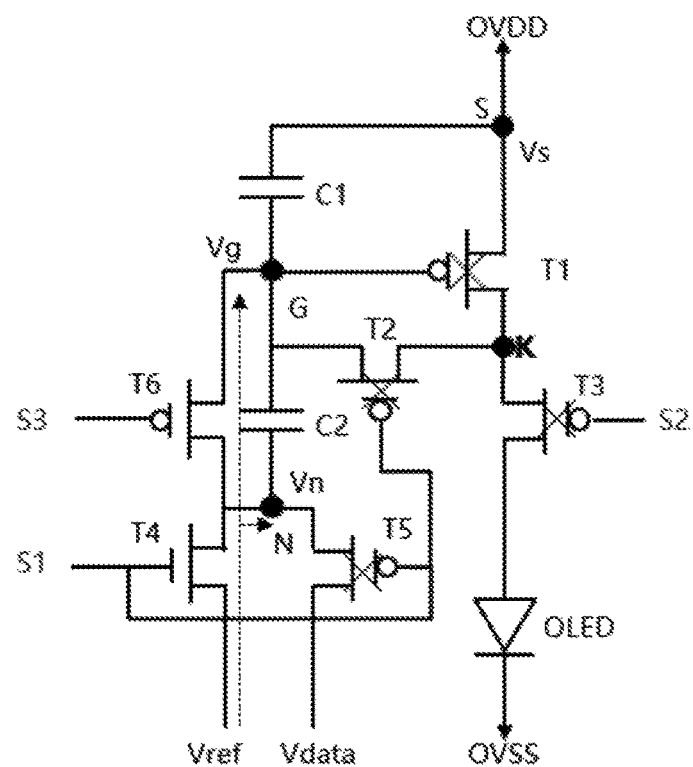
FIG. 4 is a schematic view showing the operation state in the initialization phase of a preferred embodiment of the pixel driver circuit of the present invention.

Refer to FIG. 4. FIG. 4 is a schematic view showing the operation state in the initialization phase of a preferred embodiment of the pixel driver circuit of the present invention. In the initialization phase, S1 keeps at high voltage, S2 keeps high voltage, and S3 keeps at low voltage. In the initialization phase, T4 and T6 are conductive, while T1, T2, T3 and T5 are cut off. In the initialization phase, the voltage Vg at node G is equal to Vref; the voltage Vn at node N is equal to Vref; and the voltage Vs is equal to OVDD.

Figure 5:
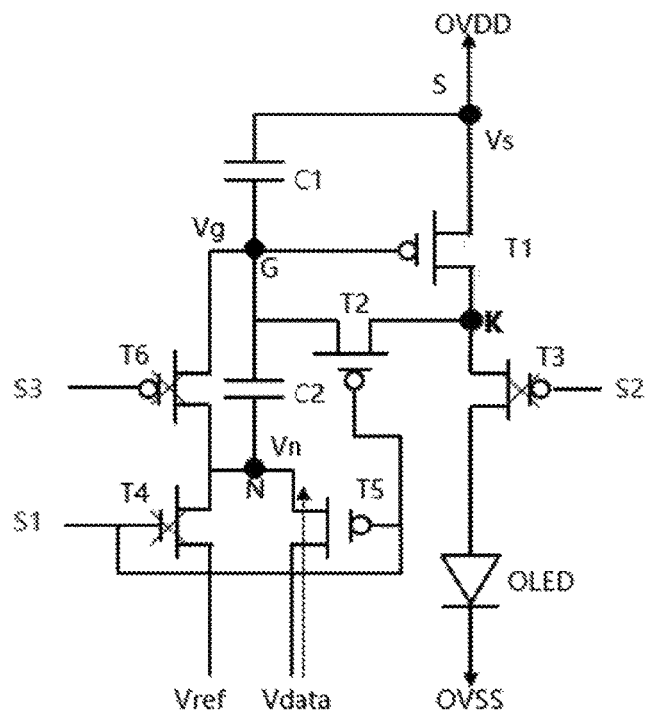
FIG. 5 is a schematic view showing the operation state in the threshold voltage detection phase of a preferred embodiment of the pixel driver circuit of the present invention.

Refer to FIG. 5. FIG. 5 is a schematic view showing the operation state in the threshold voltage detection phase of a preferred embodiment of the pixel driver circuit of the present invention. In the threshold voltage detection phase, S1 becomes low voltage, S2 keeps high voltage, and S3 becomes high voltage. In this phase, T1 is conductive until Vg becomes OVDD-Vth, and T1 is cut-off again; T3 remains cut-off and OLED cannot emit light; achieving the detection of the T1 threshold voltage Vth; the voltage Vn at node N is equal to Vdata; the voltage Vs=OVDD; and Vg=OVDD-Vth.

Figure 6:
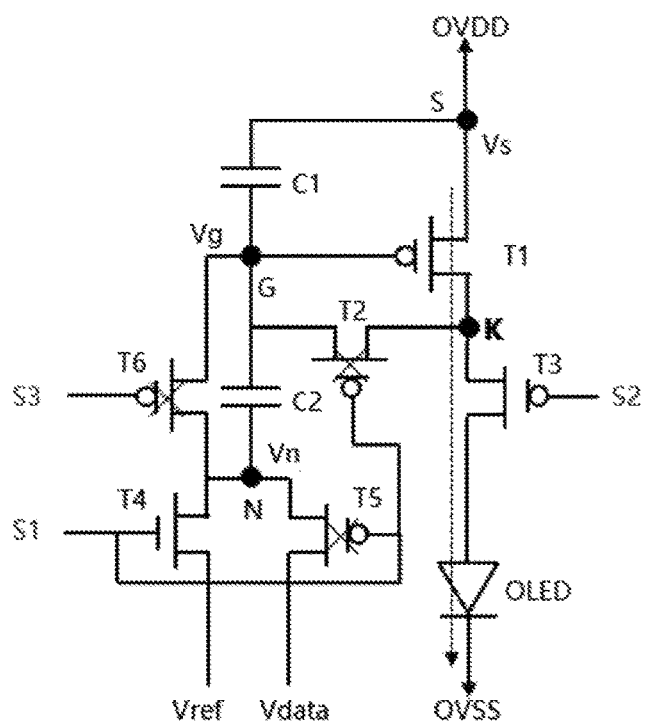
FIG. 6 is a schematic view showing the operation state in the light-emitting phase of a preferred embodiment of the pixel driver circuit of the present invention.

Refer to FIG. 6. FIG. 6 is a schematic view showing the operation state in the light-emitting phase of a preferred embodiment of the pixel driver circuit of the present invention. In this phase, S1 becomes high voltage, S2 becomes low voltage, and S3 keeps at high voltage. In the light-emitting phase, T1, t2, and T4 are conductive, while T2, T5 and T6 are cut off.

In this phase, the voltage at node N returns to Vn=Vref; Vg=OVDD-Vth-dV due to coupling of capacitors C1 and C2; wherein dV=(Vdata-Vref)*C2/(C1+C2);

$Vg=OVDD-Vth-(Vdata-Vref)*C2/(C1+C2);$ $Vs=OVDD;$

Then the current Id flowing through the OLED element is:

$$\begin{aligned} Id &= K(Vsg - Vth)^2 \\ &= K(OVDD - (OVDD - Vth - dV) - Vth)^2 \\ &= K(dV)^2 \\ &= K((Vdata - Vref)*C2/(C1+C2))^2, \end{aligned}$$

K is a constant.

According to the current Id of the OLED, Id is only related to Vdata, Vref, C1 and C2, and is irrelevant of the Vth. It should be noted that, when the parameters Vref, C1 and C2 are fixed, the current Id is only related to Vdata, which achieves the object of eliminating the Vth changes and realizes compensation of Vth.

The present invention also provides a driving method corresponding to the above pixel driver circuit. By configuring the first control signal, second control signal and third controls signal to the control signals required in the initialization phase, threshold voltage detection phase and light-emitting phase accordingly, the present invention can achieve driving control of the flat display and panel.

In summary, the pixel driver circuit and driving method of the present invention, based on a 6T2C pixel driver circuit, uses internal detection approach to eliminate the luminance inconsistency caused by change of the driving TFT threshold voltage Vth.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A pixel driver circuit, which comprises:
   a first thin film transistor (TFT), having a gate connected to a first node, a source and a drain connected respectively to a high voltage power source and a second node;
   a second TFT, having a gate connected to a first control signal, a source and a drain connected respectively to the first node and the second node;
   a third TFT, having a gate connected to a second control signal, a source and a drain connected respectively to the second node and an anode of an organic light-emitting diode (OLED),
   the OLED, having a cathode connected to a low voltage power source;
   a fourth TFT, having a gate connected to the first control signal, a source and a drain connected respectively to a third node and a reference voltage;
   a fifth TFT, having a gate connected to the first control signal, a source and a drain connected respectively to the third node and a data signal;
   a sixth TFT, having a gate connected to a third control signal, a source and a drain connected respectively to the third node and the first node;
   a first capacitor, having two ends connected respectively to the first node and the high voltage power source; and
   a second capacitor, having two ends connected respectively to the first node and the third node;
   wherein the reference voltage having a voltage level less than the data signal;
   wherein the first control signal, the second control signal, and the third control signal are configured for an initialization phase, a threshold voltage detection phase, and a light-emitting phase; and
   wherein in the initialization phase, the first control signal keeps at high voltage, the second control signal keeps at high voltage, and the third control signal keeps at low voltage.

2. The pixel driver circuit as claimed in claim 1, wherein the first TFT, the second TFT, the third TFT, the fifth TFT, and the sixth TFT are P-type TFTs, and the fourth TFT is an N-type TFT.

3. The pixel driver circuit as claimed in claim 1, wherein in the threshold voltage detection phase, the first control signal keeps at low voltage, the second control signal keeps at high voltage, and the third control signal keeps at high voltage.

4. The pixel driver circuit as claimed in claim 1, wherein in the light-emitting phase, the first control signal keeps at high voltage, the second control signal keeps at low voltage, and the third control signal keeps at high voltage.

5. A driving method of the pixel driver circuit as claimed in claim 1, wherein in the threshold voltage detection phase, the first control signal keeps at low voltage, the second control signal keeps at high voltage, and the third control signal keeps at high voltage.

6. The driving method of the pixel driver circuit as claimed in claim 1, wherein in the light-emitting phase, the first control signal keeps at high voltage, the second control signal keeps at low voltage, and the third control signal keeps at high voltage.

7. A pixel driver circuit, which comprises:
   a first thin film transistor (TFT), having a gate connected to a first node, a source and a drain connected respectively to a high voltage power source and a second node;

a second TFT, having a gate connected to a first control signal, a source and a drain connected respectively to the first node and the second node;

a third TFT, having a gate connected to a second control signal, a source and a drain connected respectively to the second node and an anode of an organic light-emitting diode (OLED), the OLED, having a cathode connected to a low voltage power source;

a fourth TFT, having a gate connected to the first control signal, a source and a drain connected respectively to a third node and a reference voltage;

a fifth TFT, having a gate connected to the first control signal, a source and a drain connected respectively to the third node and a data signal;

a sixth TFT, having a gate connected to a third control signal, a source and a drain connected respectively to the third node and the first node;

a first capacitor, having two ends connected respectively to the first node and the high voltage power source; and a second capacitor, having two ends connected respectively to the first node and the third node;

wherein the reference voltage having a voltage level less than the data signal;

wherein the first TFT, the second TFT, the third TFT, the fifth TFT, and the sixth TFT being P-type TFTs, and the fourth TFT being an N-type TFT;

wherein the first control signal, the second control signal, and the third control signal being configured for an initialization phase, a threshold voltage detection phase, and a light-emitting phase;

wherein in the initialization phase, the first control signal keeping at high voltage, the second control signal keeping at high voltage, and the third control signal keeping at low voltage;

wherein in the threshold voltage detection phase, the first control signal keeping at low voltage, the second control signal keeping at high voltage, and the third control signal keeping at high voltage.

8. The pixel driver circuit as claimed in claim 7, wherein in the light-emitting phase, the first control signal keeps at high voltage, the second control signal keeps at low voltage, and the third control signal keeps at high voltage.

* * * * *